(12) United States Patent
Tsutsui et al.

(10) Patent No.: US 10,873,269 B2
(45) Date of Patent: Dec. 22, 2020

(54) ELECTRIC POWER CONVERSION APPARATUS

(71) Applicant: DENSO CORPORATION, Kariya (JP)

(72) Inventors: Takuro Tsutsui, Kariya (JP); Daisuke Harada, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/659,705

(22) Filed: Oct. 22, 2019

(65) Prior Publication Data
US 2020/0052612 A1  Feb. 13, 2020

Related U.S. Application Data

(63) Continuation of application No. PCT/JP2018/015874, filed on Apr. 17, 2018.

(30) Foreign Application Priority Data

Apr. 25, 2017  (JP) .................. 2017-086539

(51) Int. Cl.
*H02M 7/00* (2006.01)
*H02M 7/48* (2007.01)
(Continued)

(52) U.S. Cl.
CPC ............. *H02M 7/003* (2013.01); *H02M 7/48* (2013.01); *H05K 7/20927* (2013.01); *H02M 7/12* (2013.01); *H02M 7/72* (2013.01)

(58) Field of Classification Search
CPC .......... H02M 7/003; H02M 7/12; H02M 7/28; H02M 7/72; H05K 7/20927
See application file for complete search history.

(56) References Cited

U.S. PATENT DOCUMENTS

2004/0150271 A1  8/2004  Koga et al.
2006/0207780 A1  9/2006  Shinmura et al.
(Continued)

FOREIGN PATENT DOCUMENTS

JP   H07-38025 A   2/1995
JP   2017-034012 A   2/2017

OTHER PUBLICATIONS

Jul. 3, 2018 International Search Report issued in International Patent Application No. PCT/JP2018/015874.

*Primary Examiner* — Jue Zhang
(74) *Attorney, Agent, or Firm* — Oliff PLC

(57) ABSTRACT

An electric power conversion apparatus includes: a heat-generating element; a case having a cooling wall portion on which the heat-generating element is held and accommodating the heat-generating element; a flow passage cover having an opening formed therein and covering a surface of the cooling wall portion on the opposite side to the heat-generating element; a standing portion standing from the cooling wall portion and inserted in the opening; a flow-passage side wall portion formed in one of the cooling wall portion and the flow passage cover to protrude toward the other; a coolant flow passage surrounded by the cooling wall portion, the flow passage cover and the flow-passage side wall portion; and a sealant that seals both a gap between the cooling wall portion and the flow passage cover at a periphery of the coolant flow passage and a gap between the standing portion and the flow passage cover.

10 Claims, 6 Drawing Sheets

(51) Int. Cl.
*H05K 7/20* (2006.01)
*H02M 7/72* (2006.01)
*H02M 7/12* (2006.01)

(56) References Cited

U.S. PATENT DOCUMENTS

| | | | |
|---|---|---|---|
| 2011/0285010 A1 | 11/2011 | Miyachi | |
| 2015/0036294 A1* | 2/2015 | Sharaf | H05K 7/20509 |
| | | | 361/702 |
| 2018/0083548 A1* | 3/2018 | Hagimoto | H01L 21/4878 |

\* cited by examiner

ELECTRIC POWER CONVERSION APPARATUS

CROSS-REFERENCE TO RELATED APPLICATIONS

The present application is a continuation application of International Application No. PCT/JP2018/015874 filed on Apr. 17, 2018, which is based on and claims priority from Japanese Patent Application No. 2017-086539 filed on Apr. 25, 2017. The contents of these applications are hereby incorporated by reference in their entirety into the present application.

BACKGROUND

1 Technical Field

The present disclosure relates to electric power conversion apparatuses.

2 Description of Related Art

Vehicles, such as hybrid vehicles and electric vehicles, are generally equipped with electric power conversion apparatuses that are configured to perform electric power conversion between DC power and AC power. The electric power conversion apparatuses include, for example, an electronic component for performing the electric power conversion and a case accommodating the electronic component. Moreover, the case may be formed integrally with a cooler for cooling the electronic component.

SUMMARY

According to the present disclosure, there is provided a first electric power conversion apparatus which includes: a heat-generating element; a case having a cooling wall portion on which the heat-generating element is held and accommodating the heat-generating element; a flow passage cover having an opening formed therein and covering a surface of the cooling wall portion on an opposite side to a surface of the cooling wall portion on which the heat-generating element is held; a standing portion standing from the cooling wall portion and inserted in the opening of the flow passage cover; a flow-passage side wall portion formed in one of the cooling wall portion and the flow passage cover to protrude toward the other of the cooling wall portion and the flow passage cover; a coolant flow passage surrounded by the cooling wall portion, the flow passage cover and the flow-passage side wall portion; and a sealant that seals both a gap between the cooling wall portion and the flow passage cover at a periphery of the coolant flow passage and a gap between the standing portion and the flow passage cover.

According to the present disclosure, there is also provided a second electric power conversion apparatus which includes: a heat-generating element; a case having a cooling wall portion on which the heat-generating element is held and accommodating the heat-generating element; a flow passage cover covering a surface of the cooling wall portion on an opposite side to a surface of the cooling wall portion on which the heat-generating element is held; a standing portion standing from the flow passage cover and abutting the cooling wall portion; a flow-passage side wall portion formed in one of the cooling wall portion and the flow passage cover to protrude toward the other of the cooling wall portion and the flow passage cover; a coolant flow passage surrounded by the cooling wall portion, the flow passage cover and the flow-passage side wall portion; and a sealant that seals a gap between the cooling wall portion and the flow passage cover at a periphery of the coolant flow passage.

BRIEF DESCRIPTION OF THE DRAWINGS

In the accompanying drawings:

FIG. 7 is a partially cross-sectional view taken along the line VII-VII in

FIG. 6;

DESCRIPTION OF EMBODIMENTS

Figure 1:
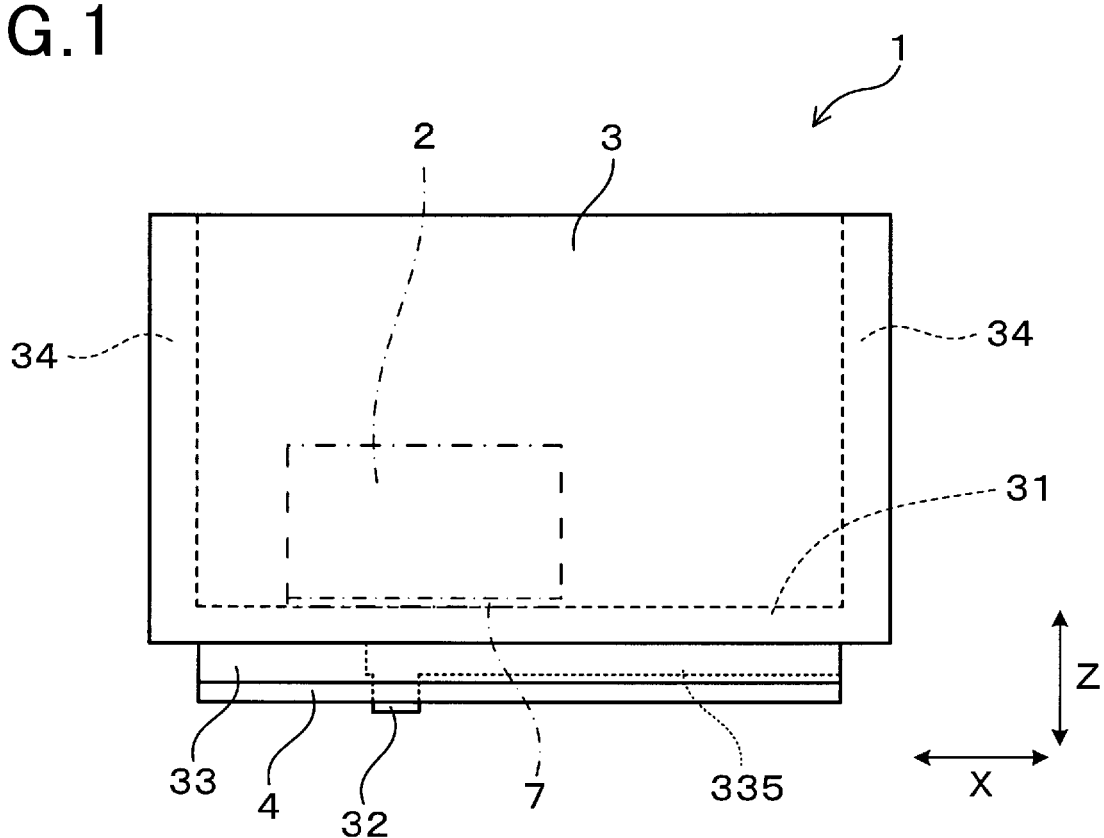
FIG. 1 is a side view of an electric power conversion apparatus according to a first embodiment.

There is disclosed, for example in Japanese Patent Application Publication No. JP2017034012A, an electric power conversion apparatus that includes a reactor and a cooling portion having at least one cooling surface for cooling the reactor. The cooling portion includes an inner wall having a cooling surface and a flow passage cover facing the inner wall. Between the inner wall and the flow passage cover, there is formed a coolant flow passage through which a coolant flows. Moreover, a sealant is provided between the inner wall and the flow passage cover to suppress leakage of the coolant.

Furthermore, between the inner wall and the flow passage cover, there may be provided fins extending from the inner wall toward the flow passage cover and/or partition walls partitioning the coolant flow passage. Distal ends of the fins and/or the partition walls are separated from the flow passage cover.

In assembling the electric power conversion apparatus disclosed in the above patent document, the electronic component may be pressed on the cooling portion after opposing the flow passage cover and the inner wall to form the coolant flow passage. At this time, since there is a gap between the inner wall of the cooling portion and the flow passage cover, the inner wall may be deformed when it becomes unable to withstand a load imposed on it by the pressing of the electronic component. Moreover, in the case where fins and/or partition walls are provided between the inner wall and the flow passage cover, the deformation of the inner wall may cause the distal ends of the fins and/or the partition walls to press the flow passage cover, thereby deforming the flow passage cover.

Moreover, upon the inner wall of the cooling portion and/or the flow passage cover being deformed with the pressing of the electronic component, damage may be caused to the sealant. Furthermore, depending on the situation, a gap may be formed between the inner wall of the cooling portion and the sealant or between the sealant and the flow passage cover, causing leakage of the coolant to the outside of the coolant flow passage.

To suppress deformation of the inner wall during the above-described assembly process, one may consider using a method of configuring the distal ends of the fins and/or the separation walls to abut the flow passage cover and supporting the inner wall via the flow passage cover, the fins and/or the separation walls. However, the case of the electric power conversion apparatus is generally formed by die casting; therefore, it is difficult to ensure high dimensional accuracy of the fins and/or the separation walls. Consequently, it is difficult to configure the distal ends of the fins and/or the separation walls to abut the flow passage cover; thus it is difficult to support the inner wall via the flow passage cover, the fins and/or the separation walls.

In contrast, the above-described first electric power conversion apparatus according to the present disclosure includes the case having the cooling wall portion and the flow passage cover covering the cooling wall portion. Between the cooling wall portion and the flow passage cover, there is formed the coolant flow passage. Moreover, the standing portion, which stands from the cooling wall portion, is inserted in the opening of the flow passage cover.

In the first electric power conversion apparatus, it is only necessary to insert the standing portion into the opening of the flow passage cover. Therefore, it is unnecessary to accurately control the dimensions of the standing portion. Consequently, the standing portion can be easily formed.

Moreover, during assembly of the first electric power conversion apparatus, after attaching the flow passage cover to the case, it is possible to place a jig to abut the standing portion, thereby supporting the cooling wall portion with the jig. Consequently, it is possible to suppress deformation of the cooling wall portion during assembly of the first electric power conversion apparatus.

On the other hand, the above-described second electric power conversion apparatus according to the present disclosure includes the case having the cooling wall portion and the flow passage cover covering the cooling wall portion. Between the cooling wall portion and the flow passage cover, there is formed the coolant flow passage. Moreover, the standing portion, which stands from the flow passage cover, abuts the cooling wall portion.

In the second electric power conversion apparatus, the standing portion is provided in the flow passage cover. Therefore, it is possible to more easily control the dimensions of the standing portion than in the case of providing the standing portion in the case. Consequently, the standing portion can be easily made to abut the cooling wall portion.

Moreover, during assembly of the second electric power conversion apparatus, after attaching the flow passage cover to the case, it is possible to place a jig to abut an outer surface of the flow passage cover at a position corresponding to the standing portion, thereby supporting the cooling wall portion with the jig. Consequently, it is possible to suppress deformation of the cooling wall portion during assembly of the second electric power conversion apparatus.

As above, the first and second electric power conversion apparatuses according to the present disclosure are configured to allow the cooling wall portion to be supported with a jig during assembly thereof. Consequently, it is possible to suppress deformation of the first and second electric power conversion apparatuses during assembly thereof.

Exemplary embodiments will be described hereinafter with reference to the drawings. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

An electric power conversion apparatus 1 according to the first embodiment will be described with reference to FIGS. 1-4.

Figure 3:
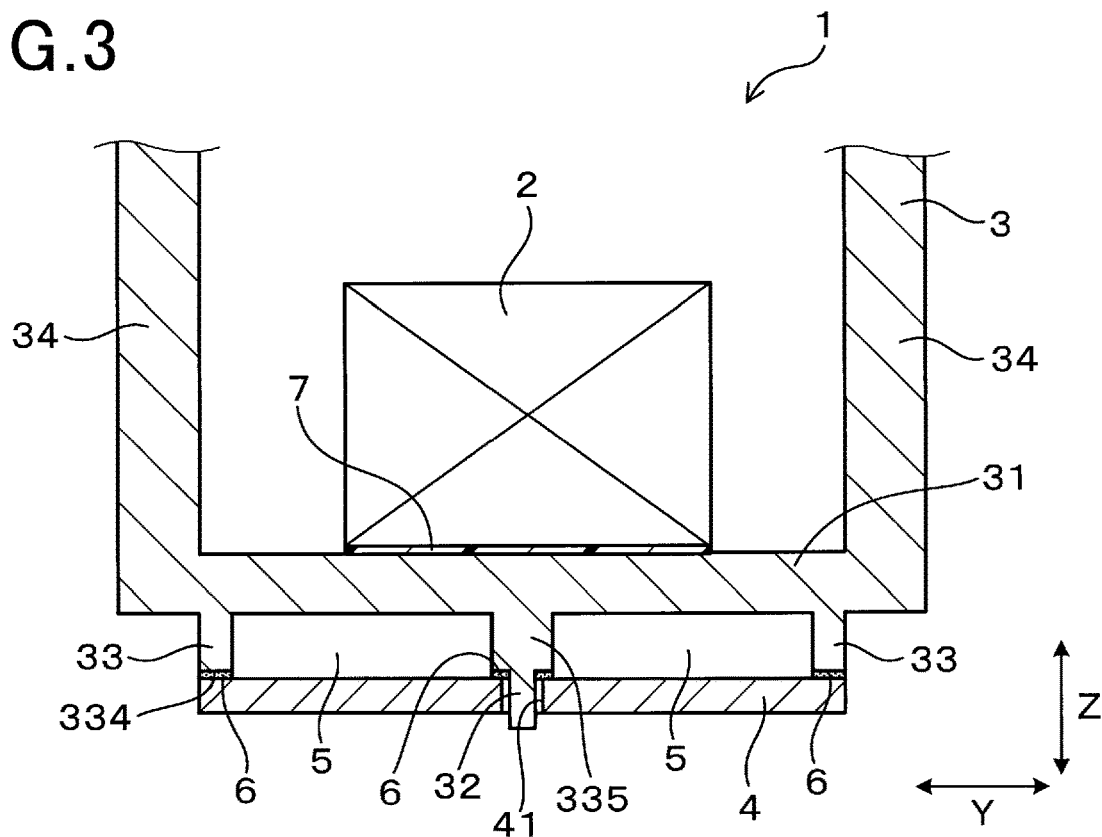
FIG. 3 is a partially cross-sectional view taken along the line in FIG. 2.

As shown in FIG. 3, the electric power conversion apparatus 1 includes: a heat-generating element 2; a case 3 having a cooling wall portion 31 on which the heat-generating element 2 is held and accommodating the heat-generating element 2; a flow passage cover 4 having an opening 41 and covering a surface of the cooling wall portion 31 on the opposite side to a surface of the cooling wall portion 31 on which the heat-generating element 2 is held; and a standing portion (or protruding portion) 32 standing from (or protruding from) the cooling wall portion 31 and inserted in the opening 41. In at least one of the cooling wall portion 31 and the flow passage cover 4, there is formed a flow-passage side wall portion 33 that protrudes toward the other of the cooling wall portion 31 and the flow passage cover 4.

Moreover, the electric power conversion apparatus 1 includes a coolant flow passage 5 surrounded by the cooling wall portion 31, the flow passage cover 4 and the flow-passage side wall portion 33. Both a gap between the cooling wall portion 31 and the flow passage cover 4 at a periphery of the coolant flow passage 5 and a gap between the standing portion 32 and the flow passage cover 4 are filled with a sealant 6.

As shown in FIGS. 1-4, the case 3 of the electric power conversion apparatus 1 according to the present embodiment includes the cooling wall portion 31 having a substantially rectangular shape and four case side wall portions 34 standing on a periphery of the cooling wall portion 31. That is, the case 3 is shaped in a substantially rectangular cuboid with one face open. Though not shown in the figures, the opening of the case 3 is covered with a lid portion. Hereinafter, a direction parallel to the longer sides of the cooling wall portion 31 will be referred to as "longitudinal direction X"; a direction parallel to the shorter sides of the cooling wall portion 31 will be referred to as "lateral direction Y"; and a direction perpendicular to both the longitudinal direction X and the lateral direction Y will be referred to as "height direction Z".

As shown in FIGS. 1 and 3, the heat-generating element 2 is held on an inner surface of the cooling wall portion 31, i.e., the surface of the cooling wall portion 31 on which the case side wall portions 34 stand upward. In the present embodiment, the heat-generating element 2 is held at a position where the heat-generating element 2 overlaps the standing portion 32 in the standing direction of the standing portion 32 (i.e., in the height direction Z). The heat-generating element 2 may be, for example, an electronic component employed for electric power conversion, such as an IGBT (Insulated-Gate Bipolar Transistor), a reactor, a capacitor or the like. More particularly, in the present embodiment, the heat-generating element 2 is a reactor.

As shown in FIG. 3, between the heat-generating element 2 and the cooling wall portion 31, there is interposed a heat-dissipating member (or heat-transferring member) 7 to facilitate heat transfer from the heat-generating element 2 to the cooling wall portion 31. The heat-dissipating member 7 may be implemented by any known heat-dissipating member having a function of facilitating heat transfer, such as a heat-transferring sheet, heat-transferring grease, or the like.

The flow-passage side wall portion 33, which forms a peripheral side surface of the coolant flow passage 5, stands on an outer surface of the cooling wall portion 31, i.e., the surface of the cooling wall portion 31 on the opposite side to the surface of the same on which the heat-generating element 2 is held.

Figure 2:
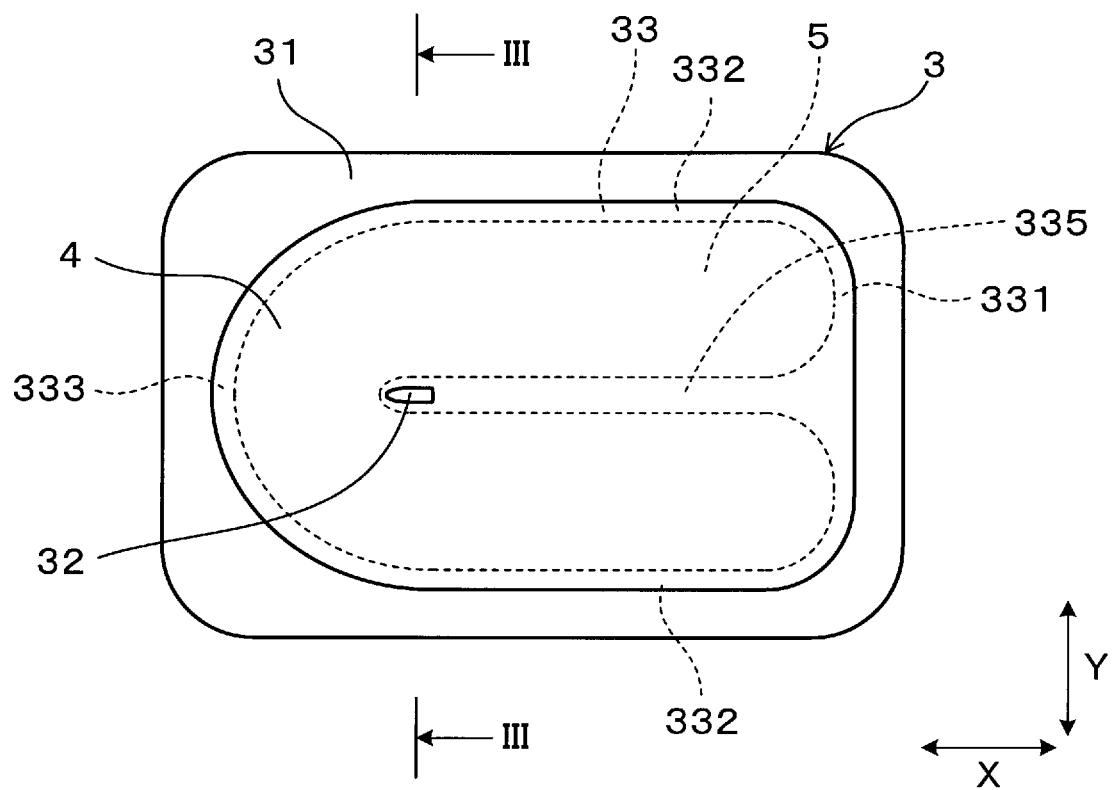
FIG. 2 is a plan view, from the side of a flow passage cover, of the electric power conversion apparatus according to the first embodiment.
Figure 4:
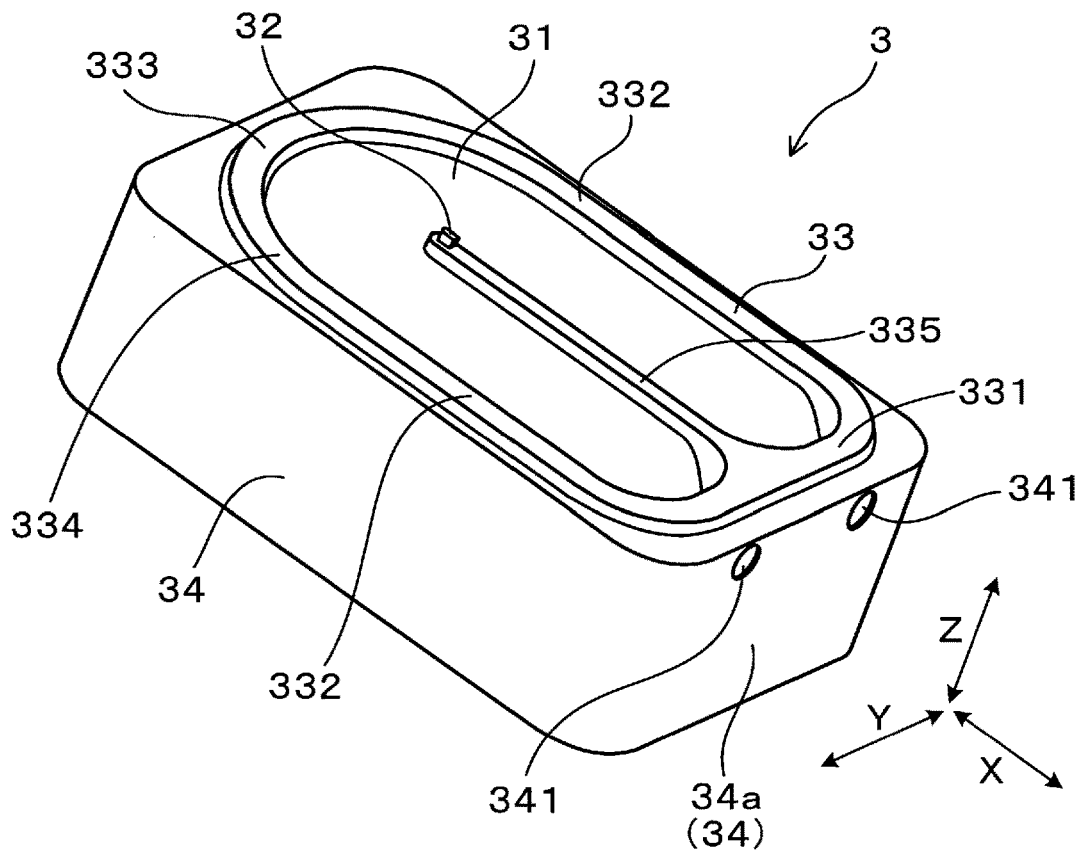
FIG. 4 is a perspective view of a case of the electric power conversion apparatus according to the first embodiment.

As shown in FIGS. 2 and 4, in the present embodiment, the flow-passage side wall portion 33 is configured to include: a first straight portion 331 arranged along one edge of the cooling wall portion 31 in the longitudinal direction X; a pair of second straight portions 332 extending in the longitudinal direction X respectively from opposite ends of the first straight portion 331; and a semicircular arc portion 333 arranged at the other edge of the cooling wall portion 31 in the longitudinal direction X to connect the pair of second straight portions 332 with each other.

As shown in FIGS. 3 and 4, an end surface 334 of the flow-passage side wall portion 33 on the flow passage cover 4 side is flat in shape. As shown in FIG. 3, the sealant 6 is arranged on the end surface 334 of the flow-passage side wall portion 33. Consequently, the gap between the flow-passage side wall portion 33 and the flow passage cover 4 is sealed with the sealant 6.

Moreover, as shown in FIGS. 2 and 4, the cooling wall portion 31 includes a partition wall portion 335 that extends, from the center of the first straight portion 331 in the lateral direction Y, toward the semicircular arc portion 333. The partition wall portion 335, together with the flow-passage side wall portion 33, forms the peripheral side surface of the coolant flow passage 5.

On a distal end portion of the partition wall portion 335 (i.e., a semicircular arc portion 333-side end portion of the partition wall portion 335), there is formed the standing portion 32 to have the shape of a column protruding outward from the distal end portion of the partition wall portion 335. The standing portion 32 is inserted in the opening 41 formed in the flow passage cover 4. Moreover, a distal end of the standing portion 32 protrudes outward from the flow passage cover 4. Furthermore, the sealant 6 is interposed between the distal end portion of the partition wall portion 335 and the flow passage cover 4. Consequently, the gap between the standing portion 32 and the flow passage cover 4 is sealed with the sealant 6.

The flow-passage side wall portion 33 and the inside space thereof in the cooling wall portion 31 are covered with the flow passage cover 4. In the present embodiment, the flow passage cover 4 is flat plate-shaped and has the opening 41 formed at a position corresponding to the standing portion 32. The standing portion 32, which stands (or protrudes) from the cooling wall portion 31, is inserted in the opening 41.

As shown in FIG. 3, in the present embodiment, the coolant flow passage 5 is constituted of the space surrounded by the cooling wall portion 31, the flow passage cover 4, the flow-passage side wall portion 33 and the partition wall portion 335. As shown in FIG. 2, the coolant flow passage 5 has, in a plan view along the height direction Z, a substantially U-shape surrounded by the flow-passage side wall portion 33 and the partition wall portion 335.

As shown in FIG. 4, the four case side wall portions 34 standing on the periphery of the cooling wall portion 31 include the case side wall portion 34a that stands from the edge of the cooling wall portion 31 including the first straight portion 331. In the case side wall portion 34a, there are formed two coolant inlet/outlet ports 341. The coolant inlet/outlet ports 341, which respectively communicate with opposite end portions of the substantially U-shaped coolant flow passage 5, are configured to supply the coolant into and discharge the same out of the coolant flow passage 5.

The sealant 6 is interposed between the flow passage cover 4 and the end surface 334 of the flow-passage side wall portion 33 over the entire perimeter of the flow-passage side wall portion 33. With the sealant 6, the gap between the flow passage cover 4 and the cooling wall portion 31 at the periphery of the coolant flow passage 5, i.e., the gap between the flow passage cover 4 and the flow-passage side wall portion 33 is sealed over the entire perimeter of the flow-passage side wall portion 33. Moreover, the sealant 6 is also interposed between the flow passage cover 4 and the standing portion 32 to fill the gap therebetween. The sealant 6 may be implemented by, for example, any known gasket such as a soft gasket formed of natural rubber or synthetic rubber, or a liquid gasket. More particularly, in the present embodiment, the sealant 6 is implemented by a liquid gasket.

The electric power conversion apparatus 1 according to the present embodiment can be assembled, for example, as follows. First, the sealant 6 is applied to the end surface 334 of the flow-passage side wall portion 33 and then dried. Next, the flow passage cover 4 is attached d to the cooling wall portion 31, with the standing portion 32 of the cooling wall portion 31 inserted into the opening 41 of the flow passage cover 4. Consequently, the coolant flow passage 5 is formed.

After the attachment of the flow passage cover 4, a jig (not shown) is placed to abut the distal end of the standing portion 32. Then, the heat-dissipating member 7 and the heat-generating element 2 are accommodated in the case 3. Thereafter, the heat-generating element 2 is fixed while being pressed toward the cooling wall portion 31. As a result, the electric power conversion apparatus 1 is obtained.

According to the present embodiment, it is possible to achieve the following advantageous effects.

The electric power conversion apparatus 1 according to the present embodiment includes the case 3 having the cooling wall portion 31 and the flow passage cover 4 covering the cooling wall portion 31. Between the cooling wall portion 31 and the flow passage cover 4, there is formed the coolant flow passage 5. Moreover, the standing portion 32, which stands from the cooling wall portion 31, is inserted in the opening 41 of the flow passage cover 4.

With the above configuration, during assembly of the electric power conversion apparatus 1, after attaching the flow passage cover 4 to the case 3, it is possible to place the jig to abut the standing portion 32, thereby supporting the cooling wall portion 31 with the jig. Consequently, it is possible to suppress deformation of the cooling wall portion 31 during assembly of the electric power conversion apparatus 1.

Moreover, in the present embodiment, in attaching the flow passage cover 4 to the cooling wall portion 31, it is possible to easily position the flow passage cover 4 by inserting the standing portion 32 into the opening 41 of the flow passage cover 4.

In the present embodiment, the heat-generating element 2 is held above the standing portion 32. Consequently, it is possible to effectively transfer the pressing force, which is applied to the cooling wall portion 31 by the pressing of the heat-generating element 2, to the jig via the standing portion 32. As a result, it is possible to more reliably suppress deformation of the cooling wall portion 31.

In the present embodiment, the sealant 6 is constituted of a liquid gasket. Compared to a soft gasket formed of natural rubber or synthetic rubber, the liquid gasket is more susceptible to damage due to deformation of the cooling wall portion 31. In this regard, with the configuration of the electric power conversion apparatus 1 according to the present embodiment, it is possible to suppress deformation of the cooling wall portion 31, thereby reducing damage to the liquid gasket.

In the present embodiment, the heat-generating element 2 is a reactor. The reactor is relatively bulky among electronic components incorporated into the electric power conversion apparatus 1; therefore, it tends to require larger pressing force when being attached to the cooling wall portion 31. However, even in this case, with the configuration of the electric power conversion apparatus 1 according to the present embodiment, it is still possible to suppress deformation of the cooling wall portion 31.

The electric power conversion apparatus 1 according to the present embodiment further includes the heat-dissipating member 7 that is interposed between the heat-generating element 2 and the cooling wall portion 31 to facilitate heat transfer from the heat-generating element 2 to the cooling wall portion 31. As described above, with the configuration of the electric power conversion apparatus 1 according to the present embodiment, it is possible to suppress deformation of the cooling wall portion 31. Accordingly, it is possible to press the heat-generating element 2 on the cooling wall portion 31 with a larger pressing force, thereby compressing the heat-dissipating member 7. Consequently, it is possible to further facilitate heat transfer from the heat-generating element 2 to the cooling wall portion 31.

Second Embodiment

Figure 5:
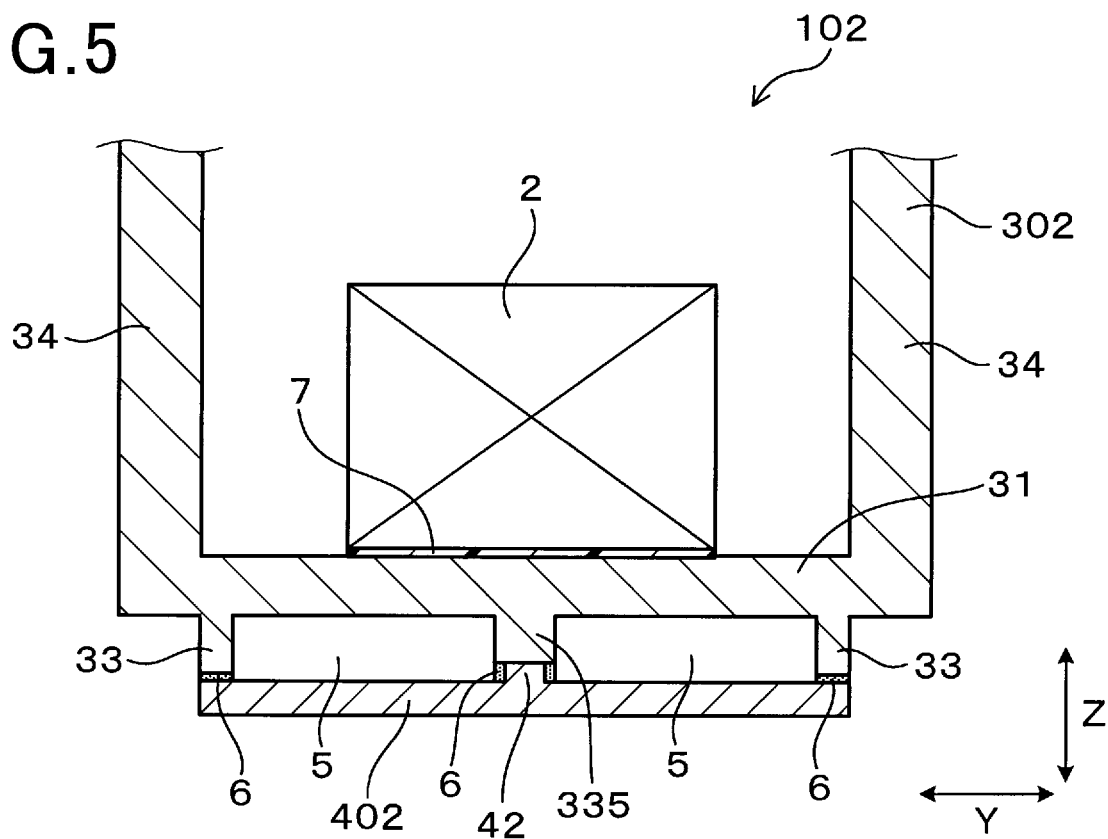
FIG. 5 is a cross-sectional view of part of an electric power conversion apparatus according to a second embodiment, which corresponds to FIG. 3.

As shown in FIG. 5, an electric power conversion apparatus 102 according to the second embodiment includes: a heat-generating element 2; a case 302 having a cooling wall portion 31 on which the heat-generating element 2 is held and accommodating the heat-generating element 2; a flow passage cover 402 covering a surface of the cooling wall portion 31 on the opposite side to a surface of the cooling wall portion 31 on which the heat-generating element 2 is held; and a standing portion 42 standing from the flow passage cover 402 and abutting the cooling wall portion 31. In at least one of the cooling wall portion 31 and the flow passage cover 402, there is formed a flow-passage side wall portion 33 that protrudes toward the other of the cooling wall portion 31 and the flow passage cover 402.

Moreover, the electric power conversion apparatus 102 includes a coolant flow passage 5 surrounded by the cooling wall portion 31, the flow passage cover 402 and the flow-passage side wall portion 33. A sealant 6 seals a gap between the cooling wall portion 31 and the flow passage cover 402 at a periphery of the coolant flow passage 5.

In the electric power conversion apparatus 102 according to the present embodiment, a partition wall portion 335 of the cooling wall portion 31 is formed to have a flat end surface on the flow passage cover 402 side. Moreover, at a position in the flow passage cover 402 corresponding to a distal end portion of the partition wall portion 335 (i.e., a semicircular arc portion 333-side end portion of the partition wall portion 335), there is formed the standing portion 42 protruding from the flow passage cover 402. The standing portion 42 abuts the distal end portion of the partition wall portion 335 upon the attachment of the flow passage cover 402 to the case 302. Moreover, the sealant 6 is interposed between the distal end portion of the partition wall portion 335 and the flow passage cover 402.

Except for the above, the configuration of the electric power conversion apparatus 102 according to the present embodiment is identical to that of the electric power conversion apparatus 1 according to the first embodiment.

According to the present embodiment, it is possible to achieve the same advantageous effects as achievable according to the first embodiment.

In particular, the electric power conversion apparatus 102 according to the present embodiment includes the case 302 having the cooling wall portion 31 and the flow passage cover 402 covering the cooling wall portion 31. Between the cooling wall portion 31 and the flow passage cover 402, there is formed the coolant flow passage 5. Moreover, the standing portion 42, which stands from the flow passage cover 402, abuts the cooling wall portion 31.

With the above configuration, during assembly of the electric power conversion apparatus 102, after attaching the flow passage cover 402 to the case 302, it is possible to place a jig (not shown) to abut an outer surface of the flow passage cover 402 at a position corresponding to the standing portion 42, thereby supporting the cooling wall portion 31 with the jig. Consequently, it is possible to suppress deformation of the cooling wall portion 31 during assembly of the electric power conversion apparatus 102.

Moreover, in the present embodiment, the flow passage cover 402 includes the standing portion 42 and thus has a higher strength than in the case of the flow passage cover 402 including no standing portion 42. Consequently, it is possible to more reliably suppress deformation of the flow passage cover 402 during and after assembly of the electric power conversion apparatus 102.

Third Embodiment

Figure 6:
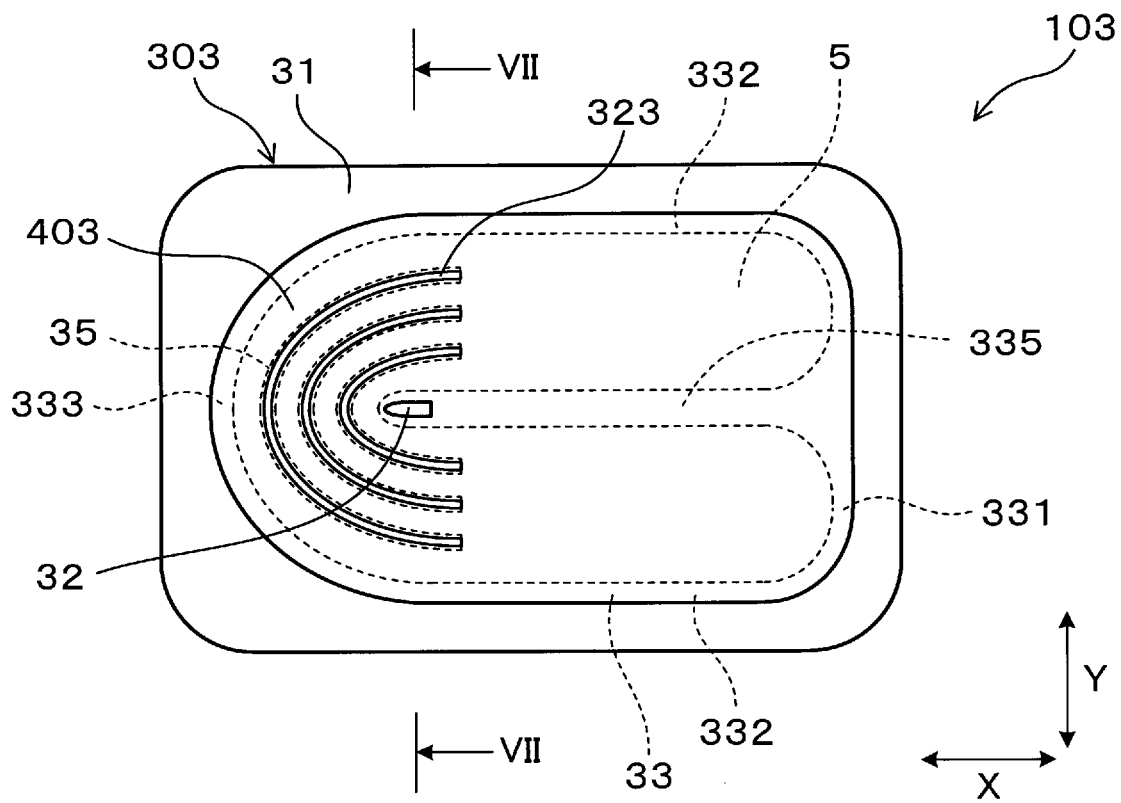
FIG. 6 is a plan view, from the side of a flow passage cover, of an electric power conversion apparatus according to a third embodiment.
Figure 7:
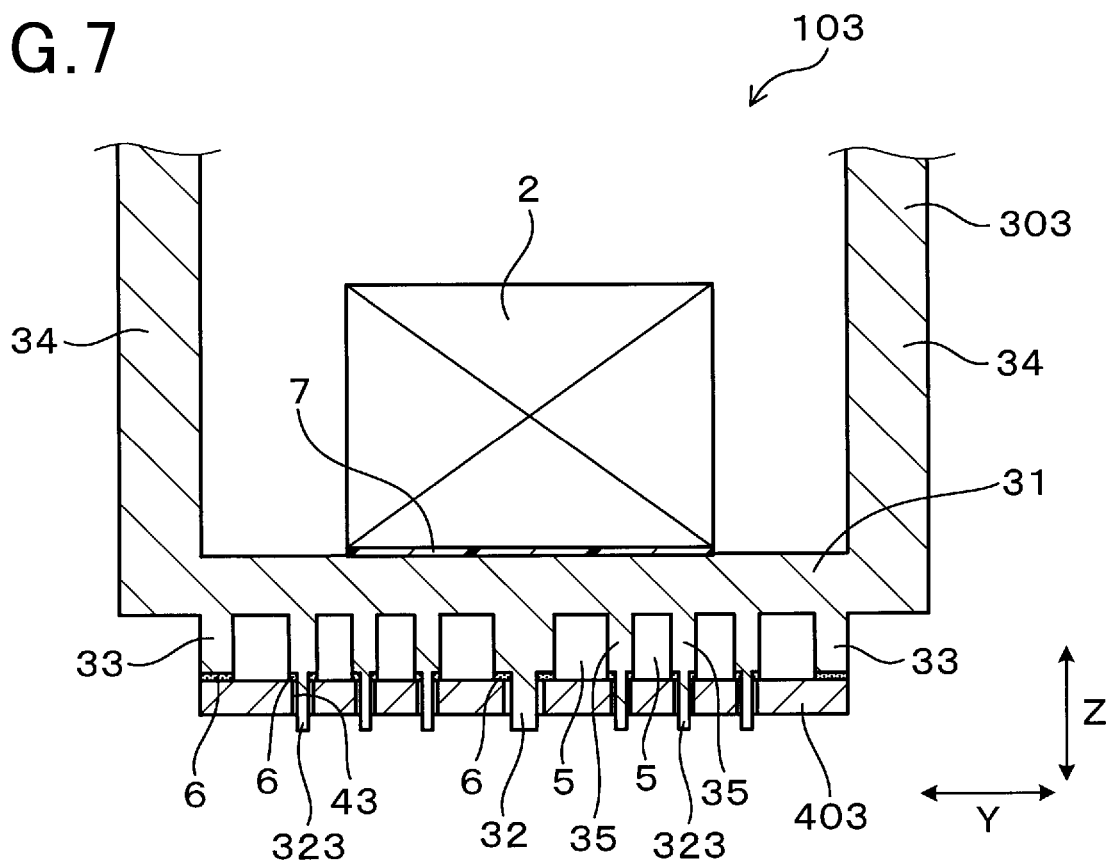

As shown in FIGS. 6 and 7, an electric power conversion apparatus 103 according to the third embodiment has both a standing portion 32 formed on a distal end portion of a partition wall portion 335 and standing portions 323 formed on end surfaces of fins 35.

In the present embodiment, a case 303 of the electric power conversion apparatus 103 has the plurality of fins 35 standing (or protruding) from the cooling wall portion 31. As shown in FIG. 6, the fins 35 are located in a curved section of a coolant flow passage 5. Each of the fins 35 has a substantially U shape in a plan view along the height direction Z. Moreover, each of the fins 35 has one of the standing portions 323 formed on the end surface thereof over the entire length thereof. The standing portions 323 have a smaller thickness than the fins 35 and respectively stand from the end surfaces of the fins 35.

As shown in FIG. 7, a flow passage cover 403 has openings 43 formed respectively at positions corresponding to the standing portions 323. In the openings 43, there are respectively inserted the standing portions 323. Moreover, a sealant 6 is interposed between the end surfaces of the fins 35 and the flow passage cover 403 to seal gaps between the standing portions 323 respectively standing from the end surfaces of the fins 35 and the flow passage cover 403.

Except for the above, the configuration of the electric power conversion apparatus 103 according to the present embodiment is identical to that of the electric power conversion apparatus 1 according to the first embodiment.

According to the present embodiment, it is possible to achieve the same advantageous effects as achievable according to the first embodiment.

In particular, the electric power conversion apparatus 103 according to the present embodiment has the fins 35 located in the coolant flow passage 5 and the standing portions 323 respectively formed on the end surfaces of the fins 35.

With the above configuration, during assembly of the electric power conversion apparatus 103, it is possible to place jigs (not shown) to respectively abut the standing portions 323 of the fins 35, thereby suppressing deformation of the cooling wall portion 31.

Moreover, in the present embodiment, the standing portions 323 are formed over the entire lengths of the respective fins 35 and the gaps between the standing portions 323 and the flow passage cover 403 are sealed with the sealant 6. Consequently, it is possible to prevent the coolant, which has flowed into spaces between adjacent fins 35, from flowing from one of the spaces to another of the spaces. As a result, it is possible to more effectively cool the heat-generating element 2.

Fourth Embodiment

Figure 8:
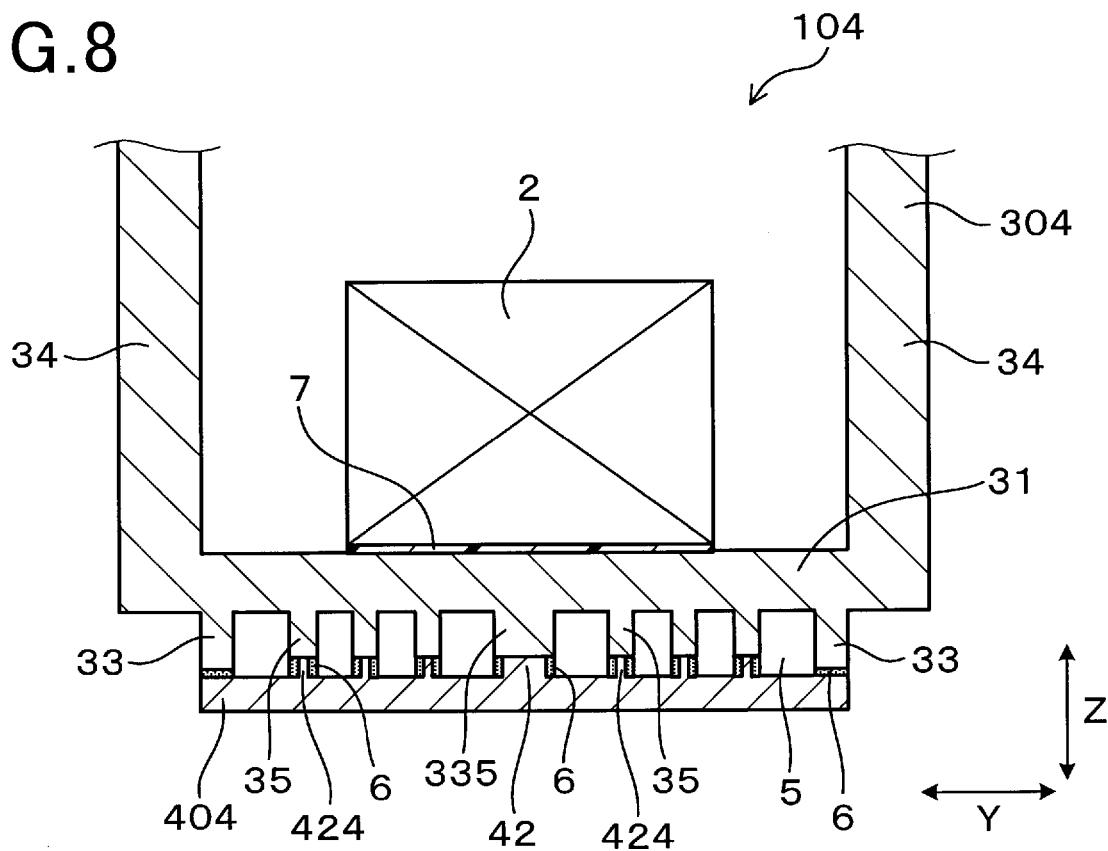
FIG. 8 is a cross-sectional view of part of an electric power conversion apparatus according to a fourth embodiment, which corresponds to FIG. 7.

As shown in FIG. 8, an electric power conversion apparatus 104 according to the fourth embodiment has both a standing portion 42 abutting a distal end portion of a partition wall portion 335 and standing portions 424 standing from a flow passage cover 404 and respectively abutting end surfaces of fins 35.

In the present embodiment, a case 304 of the electric power conversion apparatus 104 has the plurality of fins 35 standing (or protruding) from the cooling wall portion 31. In addition, though not shown in the figures, these fins 35 are located in a curved section of a coolant flow passage 5; the curved section is substantially U-shaped in a plan view seen along the height direction Z.

As shown in FIG. 8, the standing portions 424 stand from the flow passage cover 404 respectively at positions corresponding to the end surfaces of the fins 35. The standing portions 424 respectively abut the end surfaces of the fins 35. Moreover, a sealant 6 is interposed between the distal end surfaces of the fins 35 and the flow passage cover 404 to seal gaps between the standing portions 424 and the fins 35.

Except for the above, the configuration of the electric power conversion apparatus 104 according to the present embodiment is identical to that of the electric power conversion apparatus 1 according to the first embodiment.

According to the present embodiment, it is possible to achieve the same advantageous effects as achievable according to the first embodiment.

In particular, the electric power conversion apparatus 104 according to the present embodiment has the fins 35 located in the coolant flow passage 5 and the standing portions 424 standing from the flow passage cover 404 and respectively abutting the end surfaces of the fins 35.

With the above configuration, during assembly of the electric power conversion apparatus 103, it is possible to place jigs (not shown) to abut an outer surface of the flow passage cover 404 respectively at positions corresponding to the standing portion 424, thereby suppressing deformation of the cooling wall portion 31.

Fifth Embodiment

Figure 9:
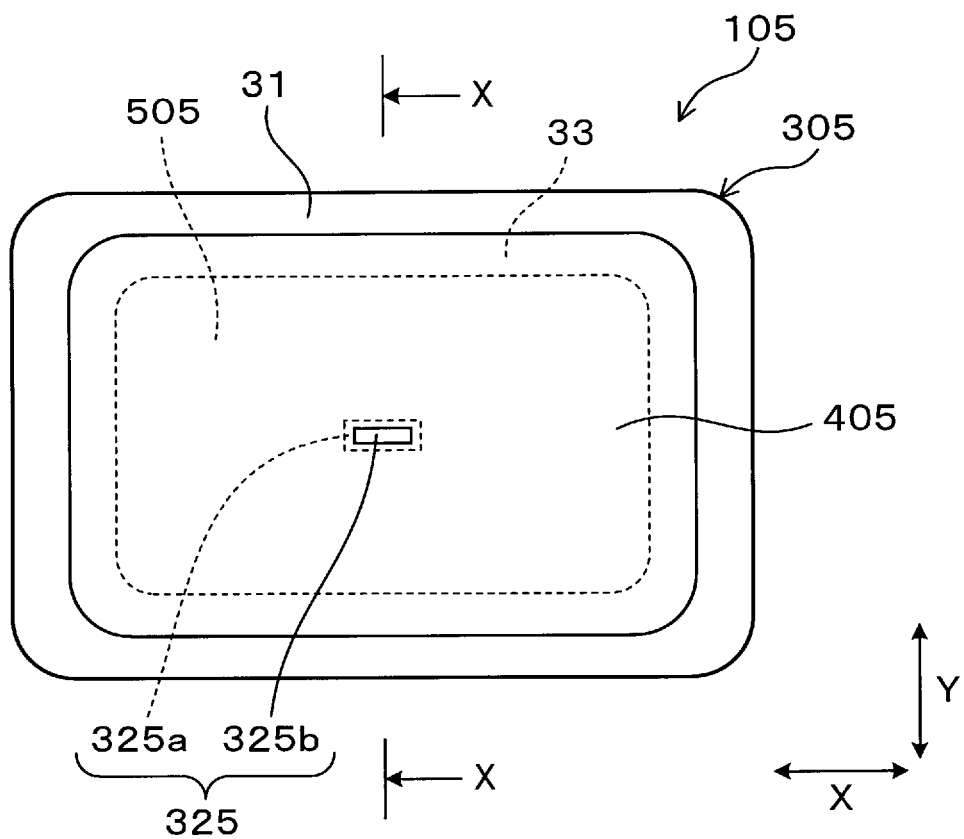
FIG. 9 is a plan view, from the side of a flow passage cover, of an electric power conversion apparatus according to a fifth embodiment.

As shown in FIG. 9, an electric power conversion apparatus 105 according to the fifth embodiment has a flow-passage side wall portion 33 standing along an outer peripheral edge of the cooling wall portion 31. A straight coolant flow passage 505, which extends in the longitudinal direction X, is formed inside the flow-passage side wall portion 33 in a plan view along the height direction Z.

Figure 11:
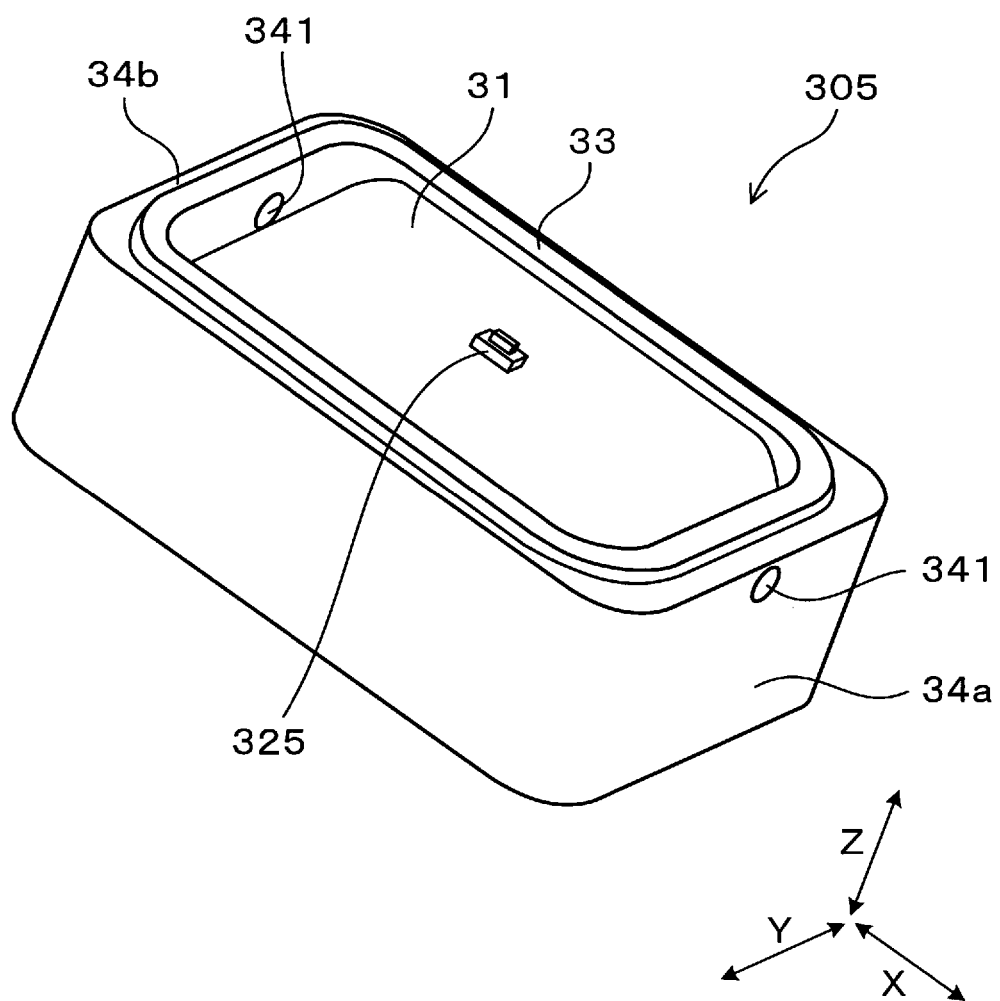
FIG. 11 is a perspective view of a case of the electric power conversion apparatus according to the fifth embodiment.

As shown in FIG. 11, the four case side wall portions 34 standing on the periphery of the cooling wall portion 31 include the case side wall portion 34a located on one side in the longitudinal direction X and the case side wall portion 34b located on the other side in the longitudinal direction X. In the case side wall portion 34a, there is formed a coolant inlet/outlet port 341 to communicate with an end portion of the coolant flow passage 505 on one side in the longitudinal direction X. In the case side wall portion 34b, there is also formed a coolant inlet/outlet port 341 to communicate with an end portion of the coolant flow passage 505 on the other side in the longitudinal direction X. These coolant inlet/outlet ports 341 are configured to supply the coolant into and discharge the same out of the coolant flow passage 505.

Figure 10:
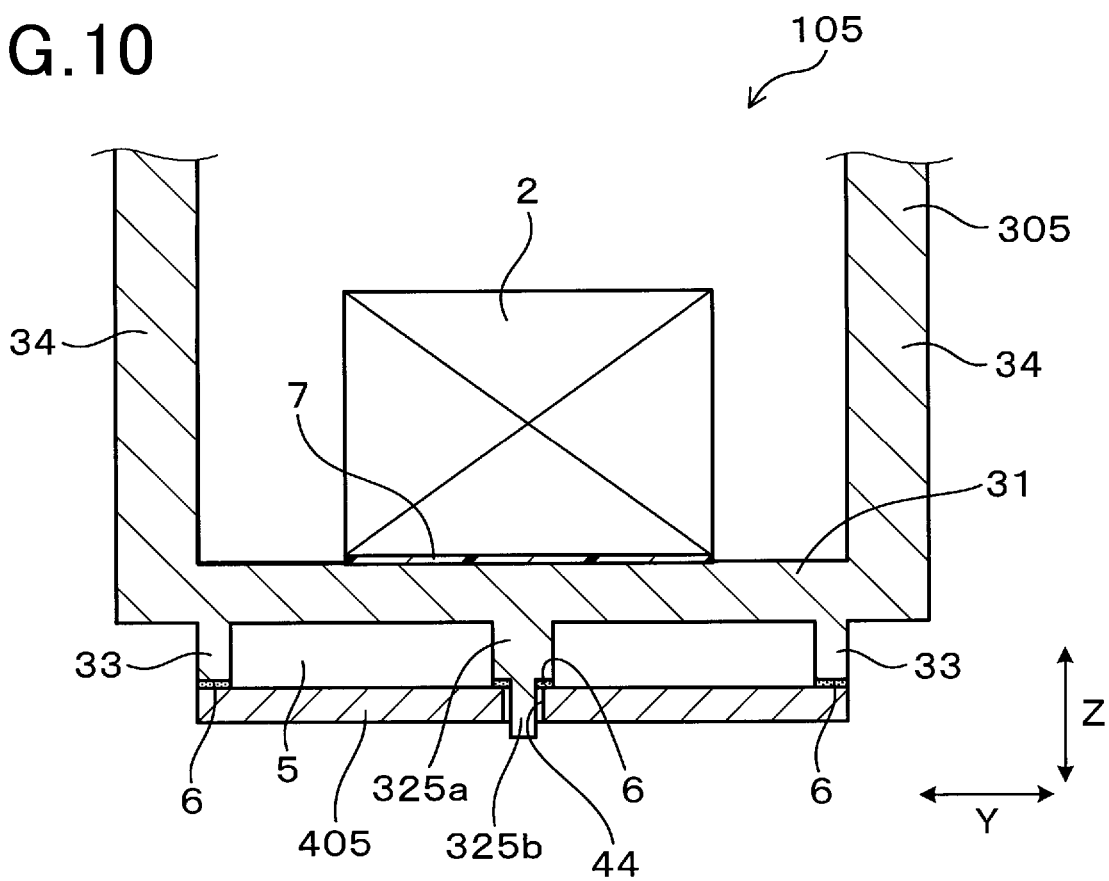
FIG. 10 is a partially cross-sectional view taken along the line X-X in FIG. 9.

As shown in FIGS. 9-11, a standing portion 325, which stands from the cooling wall portion 31, is located at the center of the coolant flow passage 505.

As shown in FIG. 10, in the present embodiment, the standing portion 325 includes a quadrangular prismatic base portion 325a standing from the cooling wall portion 31 and a distal end portion 325b formed at a distal end of the base portion 325a and shaped in a quadrangular prism thinner than the base portion 325a. The distal end portion 325b is inserted in an opening 44 formed in the flow passage cover 405. Moreover, a sealant 6 is interposed between the base portion 325a and the flow passage cover 405 to seal a gap therebetween.

Except for the above, the configuration of the electric power conversion apparatus 105 according to the present embodiment is identical to that of the electric power conversion apparatus 1 according to the first embodiment.

According to the present embodiment, it is possible to achieve the same advantageous effects as achievable according to the first embodiment.

In addition, the standing portion 325 may be provided on the partition wall portion 335 as illustrated in the first and second embodiments, on the end surfaces of the fins 35 as illustrated in the third and fourth embodiments, or separately from the partition wall portion 335 and the fins 35 as illustrated in the present embodiment. In any case, it is possible to place a jig to abut the standing portion 325 and thereby support the cooling wall portion 31; consequently, it is possible to suppress deformation of the cooling wall portion 31 during assembly of the electric power conversion apparatus.

While the above particular embodiments have been shown and described, it will be understood by those skilled in the art that various modifications, changes, and improvements may be made without departing from the spirit of the present disclosure.

For example, in the first embodiment, only one standing portion is provided on the distal end portion of the partition wall portion. However, the number and positions of standing portions are not particularly limited. For example, one standing portion may be provided on the partition wall portion over the entire length of the partition wall portion. Alternatively, the standing portion may be provided inside the coolant flow passage as illustrated in the fifth embodiment.

In the first, the third and the fifth embodiments, the distal end of the standing portion 32 protrudes from the flow passage covers 4, 403 or 405. However, the distal end of the standing portion 32 may not protrude from the flow passage covers 4, 403 or 405. In this case, the jig may have a protrusion formed at the distal end thereof; the protrusion may be inserted into the opening of the flow passage covers 4, 403 or 405 to abut the standing portion 32, thereby supporting the standing portion 32.

In the first and second embodiments, no sealant is provided between the partition wall portion and the flow passage cover. However, the sealant may be interposed between the partition wall portion and the flow passage cover to close a gap therebetween. In this case, it is possible to prevent the coolant from passing through the gap between the partition wall portion and the flow passage cover. Consequently, it is possible to more efficiently cool the heat-generating element.

In the fourth embodiment, the sealant 6 is interposed between the fins 35 and the standing portions 424. However, to reduce the amount of the sealant used and simplify the manufacturing process, no sealant may be interposed between the fins 35 and the standing portions 424.

In the first to the fifth embodiments, the flow-passage side wall portion is provided in only the cooling wall portion. However, the flow-passage side wall portion may alternatively be provided in only the flow passage cover or in both the cooling wall portion and the flow passage cover.

What is claimed is:

1. An electric power conversion apparatus comprising:
   a heat-generating element;
   a case having a cooling wall portion on which the heat-generating element is held and accommodating the heat-generating element;
   a flow passage cover having an opening formed therein and covering a surface of the cooling wall portion on an opposite side to a surface of the cooling wall portion on which the heat-generating element is held;
   a standing portion standing from the cooling wall portion and inserted in the opening of the flow passage cover;
   a flow-passage side wall portion formed in one of the cooling wall portion and the flow passage cover to protrude toward the other of the cooling wall portion and the flow passage cover;
   a coolant flow passage surrounded by the cooling wall portion, the flow passage cover and the flow-passage side wall portion; and
   a sealant that seals both a gap between the cooling wall portion and the flow passage cover at a periphery of the coolant flow passage and a gap between the standing portion and the flow passage cover.

2. The electric power conversion apparatus as set forth in claim 1, wherein the heat-generating element is arranged to overlap the standing portion in a standing direction in which the standing portion stands from the cooling wall portion.

3. The electric power conversion apparatus as set forth in claim 1, wherein the sealant is constituted of a liquid gasket.

4. The electric power conversion apparatus as set forth in claim 1, wherein the heat-generating element is a reactor.

5. The electric power conversion apparatus as set forth in claim 1, further comprising a heat-dissipating member interposed between the heat-generating element and the cooling wall portion to facilitate heat transfer from the heat-generating element to the cooling wall portion.

6. An electric power conversion apparatus comprising:
   a heat-generating element;
   a case having a cooling wall portion on which the heat-generating element is held and accommodating the heat-generating element;
   a flow passage cover covering a surface of the cooling wall portion on an opposite side to a surface of the cooling wall portion on which the heat-generating element is held;
   a standing portion standing from the flow passage cover and abutting the cooling wall portion;
   a flow-passage side wall portion formed in one of the cooling wall portion and the flow passage cover to protrude toward the other of the cooling wall portion and the flow passage cover;
   a coolant flow passage surrounded by the cooling wall portion, the flow passage cover and the flow-passage side wall portion; and
   a sealant that seals a gap between the cooling wall portion and the flow passage cover at a periphery of the coolant flow passage.

7. The electric power conversion apparatus as set forth in claim 6, wherein the heat-generating element is arranged to overlap the standing portion in a standing direction in which the standing portion stands from the flow passage cover.

8. The electric power conversion apparatus as set forth in claim 6, wherein the sealant is constituted of a liquid gasket.

9. The electric power conversion apparatus as set forth in claim 6, wherein the heat-generating element is a reactor.

10. The electric power conversion apparatus as set forth in claim 6, further comprising a heat-dissipating member interposed between the heat-generating element and the cooling wall portion to facilitate heat transfer from the heat-generating element to the cooling wall portion.

\* \* \* \* \*